United States Patent [19]

Degani et al.

[11] Patent Number: 5,473,512
[45] Date of Patent: Dec. 5, 1995

[54] ELECTRONIC DEVICE PACKAGE HAVING ELECTRONIC DEVICE BOONDED, AT A LOCALIZED REGION THEREOF, TO CIRCUIT BOARD

[75] Inventors: Yinon Degani, Highland Park; Thomas D. Dudderar, Chatham; Byung J. Han, Scotch Plains; Venkataram R. Raju, New Providence, all of N.J.

[73] Assignee: AT&T Corp., Murray Hill, N.J.

[21] Appl. No.: 260,859

[22] Filed: Jun. 16, 1994

Related U.S. Application Data

[63] Continuation-in-part of Ser. No. 168,543, Dec. 16, 1993, abandoned.

[51] Int. Cl.[6] ..................................................... H05K 7/02
[52] U.S. Cl. .................... 361/760; 361/750; 361/762; 361/807; 174/52.4; 174/256; 257/778
[58] Field of Search .................................... 361/748, 750, 361/751, 760, 761, 762, 807; 174/52.2–52.4, 255, 256, 263; 257/778, 691, 697, 659

[56] References Cited

U.S. PATENT DOCUMENTS 5,241,133  8/1993  Mullen, III et al. ................ 174/52.4
5,311,059  5/1994  Banerji et al. .......................... 257/778
5,346,118  9/1994  Degani .

FOREIGN PATENT DOCUMENTS 358046659  3/1983  Japan .................................... 257/778

Primary Examiner—Leo P. Picard
Assistant Examiner—Y. Whang
Attorney, Agent, or Firm—David I. Caplan

[57] ABSTRACT

An electronic device, such as an integrated circuit chip or a multichip module, is held in place overlying a circuit board, with which it is thermal expansion mismatched, by three or more localized rigid support elements. The bottom surface of the chip is bonded to the top surface of preferably only one of these support elements and can laterally slide along the top surfaces of the others in response to heating and cooling during electrical operations of the electronic device. In addition, the electronic device is encapsulated in a soft gel that is held in place by a rigid plastic half-shell cover that is epoxy-bonded in place along its perimeter (edge).

29 Claims, 2 Drawing Sheets

ELECTRONIC DEVICE PACKAGE HAVING ELECTRONIC DEVICE BOONDED, AT A LOCALIZED REGION THEREOF, TO CIRCUIT BOARD

CROSS-REFERENCE TO RELATED APPLICATION

This application is a Continuation-In-Part of Degani application Ser. No. 08/168,543 filed Dec. 16, 1993 (now abandoned) which is hereby incorporated by reference.

FIELD OF THE INVENTION

This invention relates to electronic devices and more particularly to packages for semiconductor electronic devices (such as silicon integrated circuit chips and modules of such silicon chips) and to methods for making such packages.

BACKGROUND OF THE INVENTION

A semiconductor electronic device—such as a silicon semiconductor integrated circuit chip, or a multichip module composed of two or more interconnected silicon semiconductor integrated circuit chips mounted on a common interconnection substrate, or at least one such chip mounted on another such chip-requires electrical access to external circuitry via a multiplicity of input-output ("I/O") terminals or metallic pads of the electronic device. Typically this access is supplied, among other things, by means of a circuit board upon which the electronic device is mounted, whereby an assembly is formed. The circuit board can take such forms as a printed circuit board or a laminated multilayer (multi-metallization-level) circuit board, the latter also being known as a "lead-frame" board. In addition, if desired, the lead-frame-board is mechanically supported by and electrically connected to, such as by means of a solder bump (globule) array or by a plug-in pin grid array, a so-called "mother board" typically having a much larger area than that of the lead-frame board; and there can be located upon this mother board a number of other electrically interconnected chips or modules as well as a number of interconnected lumped electrical elements such as capacitors, transformers, and resistors that cannot be conveniently (if at all) integrated into the chips or modules, as well as plugs and connectors.

U.S. Pat. No. 5,241,133 discloses an electronic device assembly in which a silicon integrated circuit chip is electrically connected to metallization located on an underlying printed circuit board by means of gold wire bonds. At the same time, to provide mechanical support of the silicon chip, a chip-bonding-metallization pad is located on the circuit board at a location underlying the chip, and the chip is attached to this metallization pad by means of a conductive adhesive. The lateral extent of this chip-bonding-metallization pad is almost as large as that of the chip. A problem that arises in the resulting assembly of the circuit board and the chip stems from a mismatch in thermal expansion coefficients between the board and the chip, whereby the board is undesirably stressed by the chip. The larger the lateral dimensions of the chip, the more severe the problem becomes: thermal expansion is proportional to length.

The aforementioned patent further teaches that a metallic stiffener, in the form of a plate, having a relatively high flexural modulus (in excess of about 2,000,000 psi) and coated on both sides with the adhesive, can be inserted between the metallization pad and the semiconductor chip in order to reduce the mechanical stress in the circuit board caused by the mismatch between the aforementioned thermal expansion coefficients. However, because of the inflexibility of the stiffener itself, to the extent that stress is thereby reduced in the silicon chip, undesirable strain will still be produced in the underlying circuit board. This strain is further undesirable when the circuit board is supported on a mother board by means of a solder bump array: thermal cycling during electrical operations of the chip will produce expansion-contraction cycling of the circuit board, whereby the solder bumps tend to suffer from metal fatigue and ultimate failure.

The aforementioned patent also teaches that the foregoing assembly (of silicon chip electrically connected to, and physically mounted on, the printed circuit board) is encapsulated on its top surface with a non-pliant-when-cool molding compound by means of a molding machine, in order to seal (encapsulate) the assembly and to seal the silicon chip against the ambient atmosphere as known in the art. However, the thermal expansion coefficient of the molding component cannot be equal to both that of the silicon chip and that of the (thermally mismatched) printed circuit board. Thermal cycling during electrical operations of the chip therefore will tend to cause undesirable stresses or strains either in the chip, or in the circuit board, or in both. More specifically, the thermal cycling of the molding compound will tend to cause it, after having been cured, to break away either from the chip, or from the circuit board, or from both, whereby the wire bond located in the neighborhood of such breaking tends to break. Also, the high pressure and temperature of the molding compound during molding tends to sweep away the wire bonds or to deform them such that they form a short circuit.

Therefore it would be desirable to have an electronic device package that alleviates the problems stemming from the mismatch of the thermal expansion coefficients.

SUMMARY OF THE INVENTION

This invention involves an electronic device package comprising:

(a) a circuit board;

(b) one or more support elements, located on a top surface of the circuit board;

(c) an electronic device having a bottom surface that is held spaced apart from the top surface of the circuit board by means of the one or more support elements; and (d) a localized adhesive medium, located on at least a portion of the top surface of at least one, advantageously of only one, of the support elements, whereby the bottom surface of the electronic device is bonded to at least one, advantageously only one, of the support elements to the electronic device, and whereby relative lateral motion between the electronic device and the circuit board is inhibited in a neighborhood of the one (or more, but not all) of the support elements.

In this way the fact that only one (or perhaps a few more but not all) of support elements is bonded to the electronic device reduces the stresses and strains in the package caused by mismatch between in thermal expansion coefficients of the electronic device and the circuit board. Preferably the resulting bonding area of the bottom surface of the electronic device-i.e., the area thereof contacted by the adhesive medium-is equal to or less than approximately one-tenth the total area of this bottom surface.

As used herein, the term "electronic device" includes, but is not limited to, a single semiconductor integrated circuit chip, a multichip module comprising two or more such chips located on and connected to an interconnection substrate, or a composite of one such chip or module that is flip-chip or otherwise bonded to either another such chip or another such module.

In addition, in order to mitigate the thermal mismatch problem arising from the encapsulation by the molding compound, instead of molding-compound encapsulation, the encapsulation is supplied by a pliant medium such as a soft gel that coats and advantageously covers the entire exposed portions of the top and bottom surfaces of the electronic device. In turn, the gel is covered by a hard, half-shell cover (hereinafter: "cover") having a flange that is located along its edge and that is bonded to the circuit board or to a protective layer coating a portion of the top surface of the circuit board. The purpose of this cover is to prevent the gel (which is a highly wetting substance) from flowing away from the electronic device, prior to being cured, and to facilitate handling and automated assembly to a mother board.

Only for the sake of clarity, none of the diagrams is to any scale.

DETAILED DESCRIPTION

Figure 1:
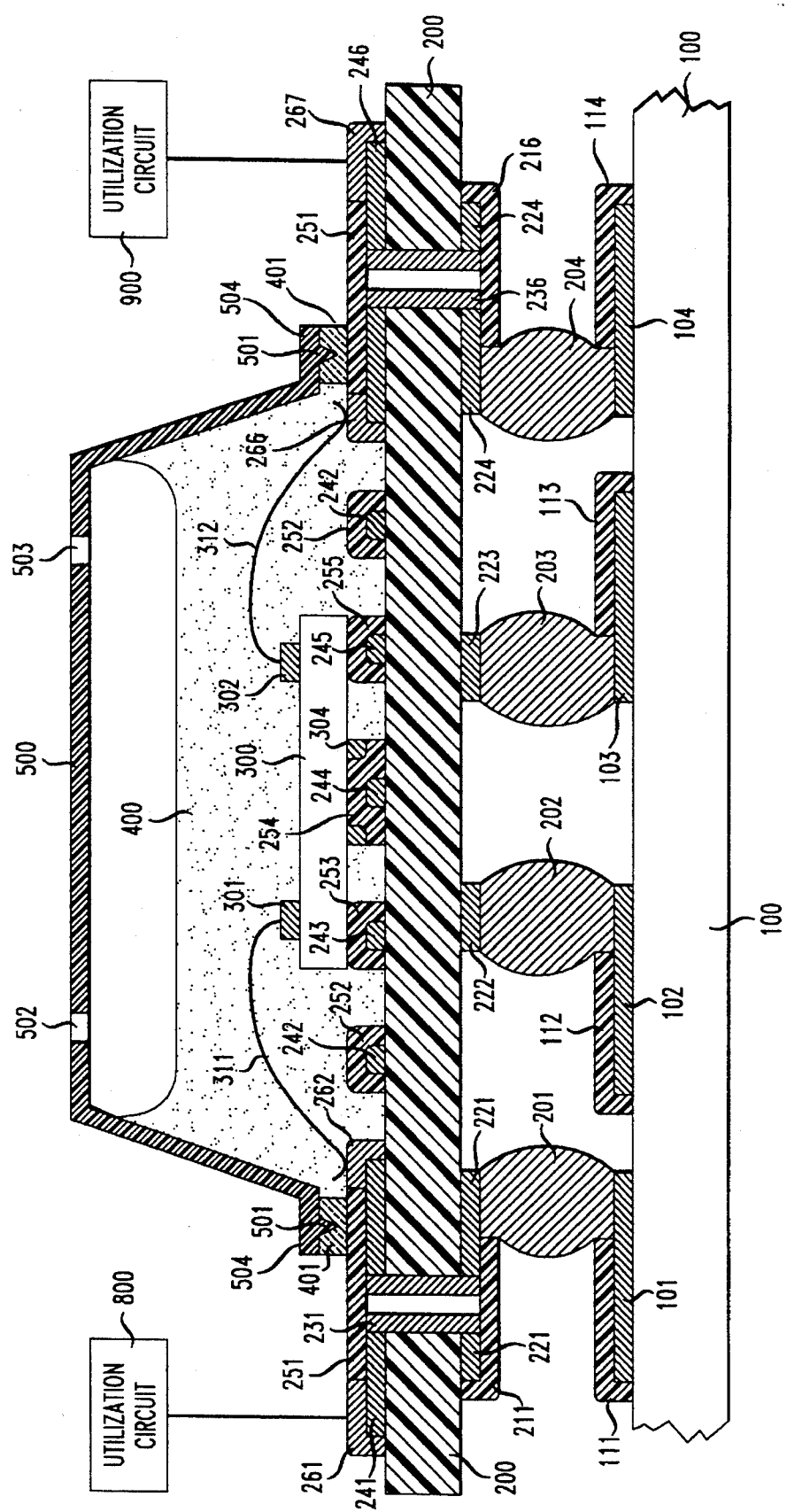
FIG. 1 is a cross-sectional elevational diagram of an electronic device package in accordance with a specific embodiment of the invention.

An electronic device package (FIG. 1) includes a circuit board 200, typically a lead-frame board, upon which is mounted electronic device in the form of a silicon semiconductor integrated circuit chip 300 by means of exemplary (illustrative) localized metallic island layers 243, 244, and 245. The top surfaces of these metallic island layers 243, 244, and 245 are coated with exemplary localized (island) support layers 253, 254, and 255, respectively. A localized adhesive layer 304 is present advantageously on a portion of one and only one of the localized support island layers, namely, on most centrally located support layer 254, in order to inhibit lateral motion of the electronic device 300 (especially during assembly). This adhesive layer 304 is typically an epoxy that has been cured by heating it after the electronic device 300 has been placed in its proper position on all the island support layers 253, 254, and 255.

As viewed from above, the chip 300 typically has a square or rectangular shape. It should be understood that there are many more (typically for a total of six) than just the two island layers 243 and 245 shown in FIG. 1 that are distributed—together with their respective localized support layers, but advantageously not with any adhesive layers—on the bottom surface of the chip 300. These localized support layers 253, 254, and 255, together with their respective underlying metallic island layers 243, 244, and 245, respectively, serve to maintain the position of the chip 300 at a desired vertical stand-off distance from the circuit board 200.

The chip 300 is encapsulated by virtue of being contacted at all exposed portions of its top and bottom surfaces by means of a soft gel medium 400 such as a silicone gel. As used herein, the term "soft" refers to the Young's modulus of the gel medium that is sufficiently low (typically less than 100 psi) as to yield a gel medium 400 which is sufficiently pliant to enable sliding of the bottom surface of the chip 300 along the top surfaces of the localized protective layers 253 and 255 during thermal cycling of the chip 300 attendant its electrical operations.

The gel medium 400 is confined by a hard, premolded half-shell cover ("cover") 500, typically made of a plastic, having a flange 504 located along its edge ("perimeter portion"). The flange 504 has a bottom surface that is flat except for a ridge 501 which can (but need not) run all the way around this edge. This cover 500 also has at least two localized cylindrical apertures (holes) 502 and 503, one of them for the purpose of enabling the gel medium 400 to be inserted as described more fully below, the other of them for enabling ambient atmosphere (air) to escape while the gel medium 400 is being inserted before it is cured. It is subsequently cured.

The bottom surface of the flange 504 is bonded, by means of a pliant adhesive epoxy layer 401, onto a continuous peripheral protective plating-mask layer 251. Exemplary wiring layers 241 and 246 are located on a top surface of the circuit board 200. It should be understood that these wiring layers 241, 246 can represent hundreds of individual printed circuit wires distributed along the perimeter portion of the cover 500, each of them being made of copper and being coated by a respective portion of the protective plating-mask layer 251. The thickness of this plating-mask layer 251 is typically in the approximate range of 10-to-50 µm, and typically it is made of a photo-definable polymer or otherwise patterned polymer. The thickness of the adhesive epoxy layer 401 is relatively quite large: typically in the approximate range of 450-to-500 µm; thus the bonding supplied by the epoxy layer 251 is quite pliant (in the horizontal direction).

A pair of spaced-apart exposed portions of the wiring layer 241 is coated with a suitable contact metallization, such as a layer gold on a layer nickel, whereby a pair of spaced-apart external and internal contact pads 261 and 262, respectively, are defined. Similarly, a pair of spaced-apart internal and external contact pads 266 and 267, respectively, are defined on the wiring layer 246. Typically, all these contact pads are plated on the wiring layer 241 by electroless or electroplating of nickel, followed by electroplating of gold. Advantageously all of these contact pads are plated immediately after completion of the protective layer 251.

The top surface of the chip 300 has exemplary I/O pads 301 and 302. Exemplary wire bonds 311 and 312 electrically connect these I/O pads 301 and 302 to the internal contact pads 262 and 266, respectively, as known in the art.

The external and internal contact pads 261 and 262, respectively, are electrically interconnected by the wiring layer 241, whereby the I/O pad 301 is electrically connected to the external contact pad 261 via the wire bond 311, the internal contact pad 262, and the wiring layer 241. Thus, the exemplary external contact pad 261 (or 267, or both) can serve as an electrical access point for the chip 300, either for testing the chip 300 or for electrically connecting utilization circuitry 800 (or 900, or both) to the chip 300.

On the top surface of the circuit board 200 is located an epoxy dam (epoxy flow stopping layer) composed of a metal layer 242 coated by a protective dam layer 252. This metal layer 242 is typically made of the same material as, and is typically formed at the same time as, the metallization wiring 241, 246. The protective dam layer 252 is typically made of the same materials, and is typically formed at the same time as the localized support layers 243, 244, 245 and the protective plating-mask layer 251, respectively. This epoxy dam takes the shape (as viewed from above) of a ring around the chip 300, and it serves the purpose of protecting the chip from epoxy contamination stemming from potential flow of the epoxy in the adhesive layer 401 especially when the epoxy is hot during the bonding of the cover 500. This epoxy advantageously has a relatively low glass transition temperature, typically approximately 45° C., but this bonding is advantageously performed when the epoxy is cured by heating it at a temperature which is above its glass transition temperature.

More specifically, bonding of the cover 500 advantageously is performed by first dipping the cover 500 into a reservoir of the uncured epoxy, whereby the entire bottom surface of the flange 504, including its ridge 501, becomes wet with the epoxy, and then (with the aid of a small downward force) placing the flange 504 into place on the protective plating-mask layer 251. The ridge 501, thus serves automatically to define the desired vertical stand-off distance of the flat bottom surface of the flange 504 from the top surface of the protection mask layer 251.

As an alternative, the ridge 501 can be omitted (i.e., the entire bottom surface of the flange 504 can be flat) when using a mechanical vertical alignment tool that can place the cover 500 into a position in which the desired vertical stand-off distance between the flange 504 and protective mask layer 251 is definable by the tool. Moreover, in such a case an uncured epoxy ring can first be placed onto the top surface of the protective mask 251 prior to the tool's placing the cover 500 into its final position (i.e., with the desired stand-off distance being typically in the aforementioned range of the thickness of the epoxy adhesive layer 401). At any rate, after placing the flange 504 into the epoxy, the epoxy is then cured by heating so as to form a permanent pliant bond between the cover 500 and the protective layer 251, regardless of the presence or absence of the ridge 501.

In order to introduce the gel medium 400, gel medium is inserted in its uncured state through the hole 502, for example, while excess air is expelled through the other hole 503. The uncured gel medium advantageously has extremely low viscosity and high surface wetting properties, and hence it rapidly flows into place through spaces between respective adjacent ones of the exemplary localized support layer 253 and 255, and the gel medium insertion process is continued until the desired level of the gel medium 400 is reached. The low viscosity of the uncured gel prevents any wire-bond sweep. The gel is then cured by heating.

Because of the aforementioned pliant properties both of the soft gel medium 400 and of the bonding between the cover 500 and the protective layer 251, the thermal expansion mismatch between the circuit board 200 and the cover 500 does not harm the integrity of the wire bonds 311 and 312 during the thermal cycling; while the circuit board 200 is free to expand or contract essentially independently of the cover 500.

The uncured gel's low viscosity and high wetting properties also assure complete underfilling of the electronic device 300 with gel, including the case in which the electronic device 300 is a multichip module consisting of two or more integrated-circuit chips that are flip-chip bonded to substrate such as a silicon or a ceramic substrate, or the case in which the electronic device 300 is a composite of one such chip or module that is flip-chip or otherwise bonded to a second such chip or module.

To summarize: during the thermal cycling produced by electrical operations of the electronic device 300, the bottom surface of the chip 300 is free to slide along the top surfaces of the localized support layers 253 and 255, and the chip itself can laterally move in the gel medium 400, whereby the thermal cycling of the gel medium attendant electrical operations of the chip 300 does not tend to produce undesirable strain or stress either in the chip 300 or in the circuit board 200, or to harm the electrical integrity of the exemplary wire bonds 311, 312.

The circuit board 200 has a separate localized via hole (aperture) extending from its bottom surface to its top surface at respective positions that are located within the lateral extent of each of the exemplary wiring layers 241, 246, as known in the art. Each of exemplary circuit-board solder pads 221 and 224, each typically copper, is located on the bottom surface of the circuit board 200 at the location of each of these apertures, as known in the art. The sidewall of each of these apertures is coated with sidewall metallization 231 and 236, typically copper. The bottom of each of these sidewall metallizations 231 and 236 electrically contacts, through solder bumps (globules) 201 and 204, respectively, electrically conductive mother-board wiring layers 101 and 104, respectively, that are located on a top surface of a mother board 100, as known in the art. A two-dimensional array of exemplary solder bumps 202, 203, typically of the order of one hundred (or more, or less) in total number, electrically connect exemplary circuit-board wiring layers 222, 223 with exemplary mother-board wiring layers 102 and 103, respectively, as known in the art. The exposed surface of each of the circuit-board solder pads 221 and 224 is coated with solder masking layer 211 and 216, respectively, as known in the art. The exposed surface of each of the mother-board wiring layers 101, 102, 103, 104 is coated with a separate solder-stop layer 111, 112, 113, 114, respectively, as known in the art.

The mother board 100 can be made of, for example, aramid, epoxy-glass, or glass-fiber-reinforced epoxy. The circuit board 200 can be epoxy, glass-fiber-reinforced epoxy, polyimide, or ceramic. This circuit board 200 advantageously can be soldered to the mother board 100 by means of the solder globules 201, 202, 203, and 204 either before or after the flange 504 has been bonded to the ridge 501 (or directly to the protective layer 251), depending upon when the gel medium 400 is cured: the soldering of the circuit board 200 to the mother board 100 advantageously is performed either before the introduction of the gel medium 400 or after its having been cured, but at any rate it is advisable that the time interval between introduction and curing of the gel be minimized.

Figure 2:
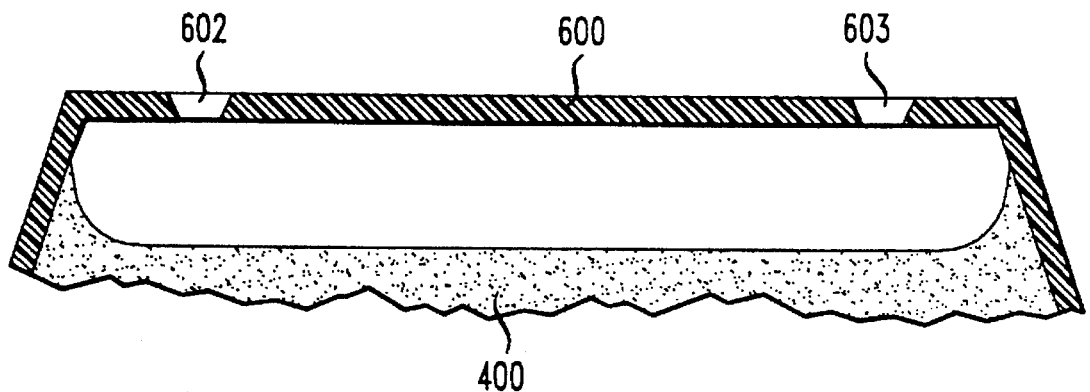
FIG. 2 is a cross-sectional elevational diagram of an electronic device package in accordance with another specific embodiment of the invention.

Referring to FIG. 2, instead of having the cylindrical apertures 502 and 503, a half-shell cover 600 has at least two tapered apertures 602 and 603. The taper of these tapered apertures 602 and 603 in such that the size (e.g., diameter) of these apertures is smaller at the inside surface than at the outside surface of the cover 600.

For example: the inside diameter of the apertures 602 and 603 are equal to approximately 1.3 mm, and their outside diameters are equal to approximately 2.0 mm. At any rate, advantageously the ratio of the outside area of each of the apertures 602 and 603 to its inside area is in the approximate range of 2.0 to 5.0. Typically such a taper is achieved by suitably designing the metal mold used to produce the cover 600 by means of a standard injection molding process. In this way, the tapers of the apertures 602 and 603 tend to suppress unwanted flow of gel through them prior to the curing of the gel medium 400. In addition, these tapers facilitate a substantially leak-proof seal between the cover 600 and the device (e.g., a tapered hollow needle) that is used to inject the gel into the cover 600.

It is further advantageous (FIG. 3) that a pair tapered apertures 702 and 703 are located at opposite ends of a diagonal of the top squared-shaped area of a cover 700. At the same time, it is advantageous that there are auxiliary flanges 705 and 708 located on one (sloping) side-wall of the cover 700 and auxiliary flanges 706 and 707 located on the opposing (sloping) sidewall thereof.

The purpose of the auxiliary flanges 705, 706, 707, and 708 is ultimately to orient the cover 700 properly with respect to a source (not shown) of the gel medium 400. To this end, a housing (not shown) has an entrance that accommodates the entry of the cover 700 if and only if none of the auxiliary flanges 705, 706, 707, or 708 prevents such entry. A placement tool (not shown) thereafter picks up the cover 700 from the housing and ultimately places it into proper position and orientation overlying the circuit board 200. Thereby the apertures 702 and 703 are properly aligned with a localized source of the gel medium 400. Typically this source comprises a dispenser (not shown) having a nozzle for ejecting the gel.

For example, there are a total of ten half-shell covers 700 overlying an array of two by five electronic devices 300, in turn overlying the circuit board 200. The placement tool places each of the ten covers into their ten respective proper positions overlying the ten respective electronic devices.

Figure 3:
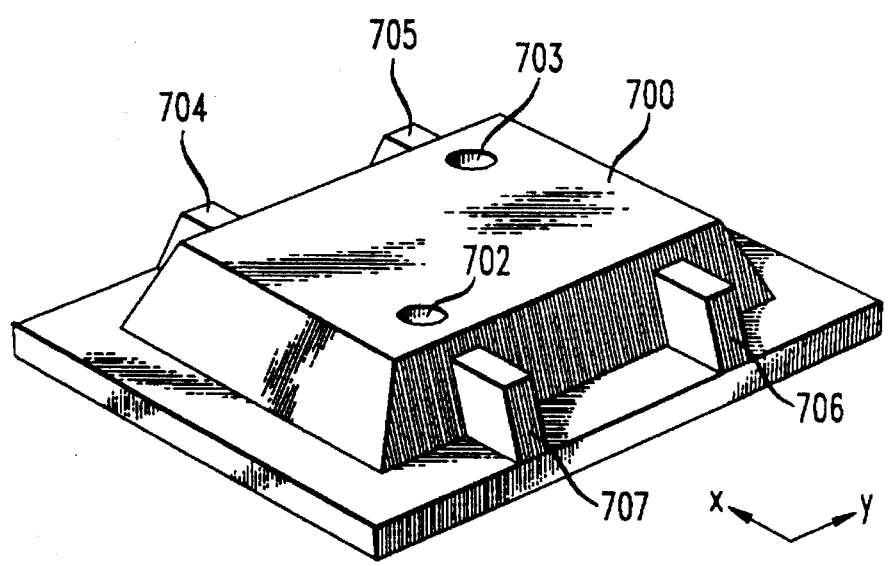
FIG. 3 is a top-view perspective diagram of an electronic device package in accordance with yet another specific embodiment of the invention.

More specifically, if the cover 700 is oriented in the horizontal (xy) plane as shown in FIG. 3, or is rotated through an angle of 180° in the horizontal plane, then and only then will the cover 700 be able to enter into the above-mentioned housing. The flanges thus act as mechanical stops, to prevent the cover 700 from entering the housing at an unwanted orientation. Thus, unwanted orientations of the cover 700 with respect to the placement tool, and hence ultimately with respect to the localized source of the gel medium, are prevented. To illustrate: starting from an initial position suitable for receiving the gel from the localized gel-source, although a rotation of 180° in the horizontal plane restores the cover 700 to a suitable gel-receiving position, a rotation of 90° does not (owing to a lack of 90°-rotational-symmetry property of the two apertures 702 and 703). Thus the auxiliary flanges 705, 706, 707, and 708 allow the cover 700 to enter the above-mentioned housing only at a wanted orientation.

In this way, for example, by randomly shaking up a cover 700 together with its underlying parts, the cover 700 can and will enter the housing in such a way that localized gel-source ultimately will be properly aligned with one of the apertures 702 or 703.

Although the invention has been described in detail with respect to a specific embodiment, various modifications can be made without departing from the scope of the invention. For example, the solder bumps 201, 202, 203, 204 can be made as described in the pending patent application Ser. No. 08/128,492 (Degani 14-8-4), or can be a plug-in pin array as known in the art. Alternatively, the mother board 100 can be omitted and all access circuitry can then be located on or in the circuit board 200, especially in cases where the latter is a laminated multilayer-metallization board.

Also, instead of the supports elements being supplied by the metallic islands 243, 244 and 245 coated by the localized support layers 253, 254 and 255, respectively, these support elements can be supplied, for example, by localized polymer layer alone or by indentation regions ( and, hence complementary raised regions) that have been fabricated (as by means of embossing) in the top surface of the circuit board 200. Moreover, the (centralized) support element formed by the localized support layer 254 and its underlying metallic island layer 244 can be consolidated with one or more of the other support elements such as the support elements formed by the localized support layers 253 and 255 together with their respective underlying metallic island layers 243 and 245, whereby only a single support element is formed, with the adhesive medium 300 being advantageously located only on a central region of this single support element so that the chip 200 is free to slide laterally at the peripheral regions of this support element. Also, the localized adhesive medium 304 can be distributed on one or more of the other support elements, especially if the totality of all areas of contact of the adhesive medium to support elements is confined to a central region of the chip 300 having an area that is small compared with—advantageously less than one-tenth than—that of the bottom surface of the chip.

The utilization circuitry 800 or 900, or both, can include test circuitry, and further utilization circuitry (not shown) can be connected to the one or more of the mother-board wiring layers 101, 102, 103, 104, as known in the art.

We claim:

1. A combination comprising an electronic device package including:
   (a) a circuit board;
   (b) one or more support elements each located on a top surface of the circuit board;
   (c) an electronic device having a bottom surface that is held spaced apart from the top surface of the circuit board by means of the one or more support elements; and
   (d) a localized adhesive medium, located on a portion of the top surface of at least one of the support elements, whereby the bottom surface of the electronic device is bonded to the top surface of at least one of the supporting elements the totality of all areas of contact of the adhesive medium to the bottom surface of the electronic device being confined to a localized region of the bottom surface of electronic device, the localized region having an area that is less than approximately one-tenth the area of the bottom surface of the electronic device, whereby regions of the electronic device remote from the localized region are free to move laterally with respect to the top surface of the circuit board in response to changes in temperature.

2. The combination of claim 1 further comprising
   (a) a cover located spaced-apart from the electronic device having a perimeter surface that is bonded either to the circuit board or to a protective layer coating a portion of the top surface of the circuit board; and
   (b) a pliant medium contained within the cover and coating the exposed top and bottom surfaces of the electronic device.

3. The combination of claim 2 in which the pliant medium is a gel.

4. The combination of claim 3 in which each of the support elements comprise a metal layer.

5. The combination of claim 4 in which an exposed top surface of each metal layer is coated with a protective coating.

6. The combination of claim 2 in which the cover is pliantly bonded to the circuit board.

7. The combination of claim 2 in which the cover has at least two localized apertures.

8. The combination of claim 7 in which the apertures are tapered.

9. The combination of claim 8 in which the ratio of the outside area to the inside area of each of the apertures is in the approximate range of 2.0 to 5.0.

10. The combination of claim 7 in which the cover has at least a first and a second flange located on first and second opposing sidewalls, respectively, of the cover.

11. The combination of claim 2 in which the localized adhesive medium is located on a portion of the top surface of one and only one of the support elements.

12. The combination of claim 1 in which each of the support elements comprise a metal layer.

13. The combination of claim 12 in which an exposed top surface of each metal layer is coated with a protective coating.

14. The combination of claim 1 in which the localized adhesive medium is located on one and only one of the support elements.

15. The combination of claim 14 further comprising (a) a cover located spaced-apart from the electronic device having a perimeter surface that is bonded either to the circuit board or to a protective layer coating a portion of the top surface of the circuit board; and (b) a pliant medium, located within the cover, coating the exposed top and bottom surfaces of the electronic device.

16. The combination of claim 15 in which the pliant medium is a gel.

17. The combination of claim 16 in which each of the support elements comprise a metal layer.

18. The combination of claim 17 in which an exposed top surface of each metal layer is coated with a protective coating.

19. The combination of claim 17 in which the cover is pliantly bonded to the circuit board.

20. The combination of claim 1 in which each of the support elements comprise a metal layer.

21. The combination of claim 20 in which an exposed top surface of each metal layer is coated with a protective coating.

22. The combination of claim 21 in which the cover has at least two localized apertures.

23. The combination of claim 22 in which the apertures are tapered.

24. The combination of claim 23 in which the ratio of the outside area to the inside area of each of the apertures is in the approximate range of 2.0 to 5.0.

25. The combination of claim 1 in which there is more than one of the support elements and in which the localized adhesive medium is located on a portion of the surface of one and only one of the support elements.

26. The combination of claims 1, 2, 3, 6, 7, 8, 9, 11, 12, 13, 14, 15, 16, 19, 22, 25, or 10 further comprising utilization circuitry electrically connected to the electronic device by electrically conductive means.

27. The combination of claims 2, 3, 6, 7, 8, 15, 16, 19, 22, 23, 24, or 10 further comprising (a) utilization circuitry, and (b) electrically conductive means for electrically connecting the electronic device to the utilization circuitry, the electrically conductive means comprising a metallic layer, located on the top surface of the circuit board, running underneath the edge of the cover.

28. The combination of claim 1 in which the number of localized support elements is equal to one.

29. The combination of claim 28 further comprising (a) utilization circuitry, and (b) electrically conductive means for electrically connecting the electronic device to the utilization circuitry, the electrically conductive means comprising a metallic layer, located at the top surface of the circuit board, running underneath the edge of the cover.

* * * * *